United States Patent [19]
Embree

[11] Patent Number: 5,187,637
[45] Date of Patent: Feb. 16, 1993

[54] MONOLITHIC HIGH-VOLTAGE CAPACITOR

[75] Inventor: Milton L. Embree, Muhlenberg Township, Berks County, Pa.

[73] Assignee: AT&T Bell Laboratories, Murray Hill, N.J.

[21] Appl. No.: 837,305

[22] Filed: Feb. 14, 1992

[51] Int. Cl.$^5$ .................. H01G 4/06; H01L 27/02
[52] U.S. Cl. .................. 361/313; 257/646; 257/532
[58] Field of Search .............. 357/51; 29/25.42; 361/311, 312, 313

[56] References Cited

U.S. PATENT DOCUMENTS

| | | | |
|---|---|---|---|
| 3,273,033 | 9/1966 | Rossmeisl | 361/313 |
| 4,167,018 | 9/1979 | Ohba et al. | 357/51 |
| 4,805,071 | 2/1989 | Hutter et al. | 361/313 |
| 4,949,154 | 8/1990 | Haken | 357/54 |

FOREIGN PATENT DOCUMENTS 177957  8/1987  Japan ........................ 357/51

OTHER PUBLICATIONS

"A model describing the electrical behavior of a-SiN:H alloys", *J. App. Phys.*, 60(4), Aug. 15, 1986 J. W. Osenbach and W. R. Knolle pp. 1408 through 1416.

Primary Examiner—Donald A. Griffin
Attorney, Agent, or Firm—Scott W. McLellan

[57] ABSTRACT

A high voltage capacitor structure for integrated circuits or the like. The capacitor includes a provision for equalizing charge when multiple capacitors are series coupled. Charge is equalized by a SiN layer overlaying, and in contact with one terminal of, the capacitor. A ground ring surrounds the capacitor structure and is also overlayed by, and in contact with, the SiN layer.

24 Claims, 2 Drawing Sheets

MONOLITHIC HIGH-VOLTAGE CAPACITOR

BACKGROUND OF THE INVENTION

1. Field of the Invention

This invention relates to capacitors in general and, more particularly, to high-voltage capacitors integratable with other circuitry on a common substrate.

2. Description of the Prior Art

For an increasing number of applications, such as for power supply and telephony applications, coupling capacitors are needed that can sustain high voltages (e.g. 1000 volts or greater) while providing moderate amounts of capacitance. Preferably, the capacitors are integrated along with other circuitry on a common silicon substrate.

Most monolithic capacitors, fabricated using existing integrated circuit processing technology, have a breakdown voltage limited to about 1500 volts. For some applications this may be insufficient to meet circuit requirements. To be able to tolerate voltages higher than the breakdown voltage of a single capacitor, two or more monolithic capacitors are placed in series. Thus, the total voltage impressed across the capacitors is the sum of the voltages across each capacitor in series. In theory, the voltage across each capacitor is less than the breakdown voltage thereof. However, if these is any leakage current through one of the capacitors, the voltage across that capacitor will tend toward zero, forcing a higher voltage across the remaining capacitor(s). The higher voltage may be greater than the remaining capacitor(s) can handle, causing a catastrophic breakdown in the remaining capacitor(s).

Intentional leakage across each capacitor(s) is sometimes used to force equalization of the voltages across the individual capacitor(s). A fixed resistor is coupled across each series capacitor to provide the intentional leakage. The amount of resistance is sufficiently low such that the leakage current therethrough is much greater than the amount of expected leakage through the corresponding capacitor. The intentional leakage overcomes the effect of the leakage through the capacitor. This solution may not be acceptable because the amount of intentional leakage may be more than what can be tolerated in a particular application. In addition, adding resistors to each capacitor may not be possible nor desirable depending on the topology of the capacitor.

Thus, it would be desirable to provide a monolithic capacitor that does not require a leakage resistor when disposed in series with other similar capacitors in high-voltage applications.

SUMMARY OF THE INVENTION

A capacitor having a first plate and a second plate, the second plate being formed over, and insulate from, the first plate. The capacitor is characterized by a layer of semi-insulating material disposed in contact with the second plate. A conductor, separate from the second plate is placed in contact with the layer of semi-insulating material.

In addition, a method of making a capacitor is presented. The capacitor has a first plate and a second plate, the second plate being formed over, and insulated from, the first plate. The method of making the capacitor is characterized by forming a conductor separate from the second plate, and depositing a layer of semi-insulating material in contact with the second plate and the conductor.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
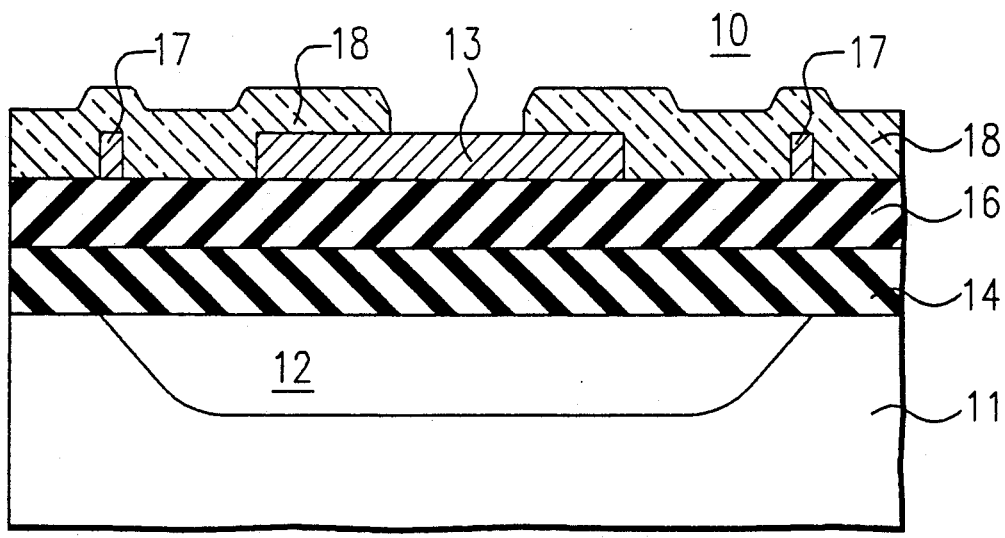
FIG. 1 is a cross section (not to scale) of a high-voltage capacitor according to one embodiment of the invention; and, FIG. 2 is a top view (not to scale) of the high-voltage capacitor of FIG. 1 with layer 18 of FIG. 2 removed; and, FIG. 3 is an illustration of two pairs of serially coupled exemplary, high-voltage capacitors according to the capacitors in the pairs being disposed on separate chips.

In an exemplary embodiment of the invention, a high-voltage monolithic capacitor 10 is shown in FIG. 1 (not to scale) formed on a substrate 11. A fist plate (not numbered) of the capacitor 10 is formed by a conductive region 12 in the substrate 11. Dielectric layers 14 and 16 insulate a second plate 13 of the capacitor 10 from the first plate. In addition to the second plate 13, a conductor 17 (here a ring) is disposed on the dielectric layers 14 and 16. The conductor 17 is separate (i.e., spaced) from the second plate 13. Added over the plate 13 and the conductor 17 is a layer of semi-insulating material 18. Thus, the semi-insulating layer 18 contacts both the second plate 13 of the capacitor 10 and the conductor 17. With the conductor 17 connected to a fixed potential (e.g., ground), the semi-insulating layer 18 serves to equalize the voltage on the capacitor 10 when multiple capacitors 10 are coupled in series. Alternatively, the conductor 17 may be coupled to the first plate (region 12) of the capacitor 10 to equalize the voltage thereon.

Discussing the exemplary capacitor 10 in more detail, the first plate is preferably formed by implanting a dopant into the substrate 10 to form region 12. For purposes here, the region 12 is also referred to as the first plate of the capacitor 10. Next, a layer of oxide 14 is deposited, then a layer of phosphorus doped glass (P-glass) 16. It is noted that one to the layers 14, 16 may be removed or other dielectric layers may be added to the disclosed embodiment. Such layers may include silicon nitride layer(s).

On top of the P-glass 16 a metal layer is deposited and patterned to form the top, or second, plate 13 of the capacitor 10 and a conductor 17. The conductor 17 (here, shaped as a ring) is spaced from, and not in contact with, the plate 13. Over the plate 13 and the conductor 17 a layer 18 of semi-insulating material, such as SiN ( a silicon nitride), is deposited. The layer 18 is opened over the plate 13 for contacting thereto by, for example, wire-bonding.

Figure 2:
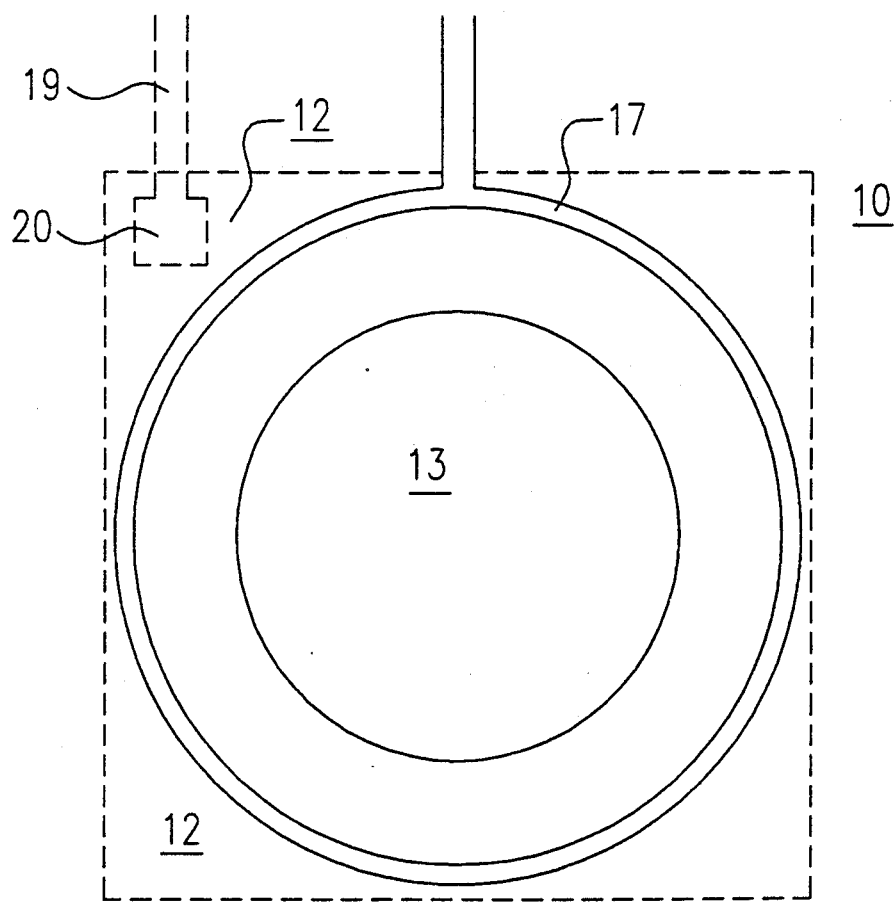

In FIG. 2, a top-view of the exemplary capacitor 10 is shown but with layer 18 (FIG. 1) omitted. Here, metal plate 13 is shown surrounded by conductor 17 on the dielectric layer 16 (not shown). The region 12 in the substrate (normally hidden by the dielectric layers 14 and 16 in FIG. 1) is shown being contacted by metal conductor 19 using a conventional substrate-to-metal connection 20. Although the conductor 17 is shown as a ring completely surrounding plate 13, it is understood that other geometrical shapes may be used for the "ring" conductor 17 and that the ring need not be closed. Further, the shape of plate 13 and region 12 need not be that as shown in the figures. Still further, the first plate of the capacitor need not be formed in the substrate; a metal layer supported between dielectric layers below the second plate 13 may be used.

The thicknesses and composition of the dielectric layers 16 and 18 (FIG. 1) may be adjusted to establish the breakdown voltage of the capacitor 10 as well as the capacitance thereof. In addition, the area of the plates (12, 13) may be changed to adjust the capacitance of the capacitor 10.

The SiN layer 18 acts both as a passivation layer and as a path for current when the voltage on the capacitor is too large—a "safely valve" for the capacitor 10. One explanation for how current "leaks" though the silicon nitride is by a Frenkel-Poole conduction mechanism within the nitride. This mechanism and other known electrical properties of silicon nitride are discussed in detail in the *Journal of Applied Physics*, Vol. 60, Number 4, pp. 1408-146, by J.W. Osenbach and W.R. Knolle, published Aug. 15, 1986, and incorporated herein by reference.

Figure 3:
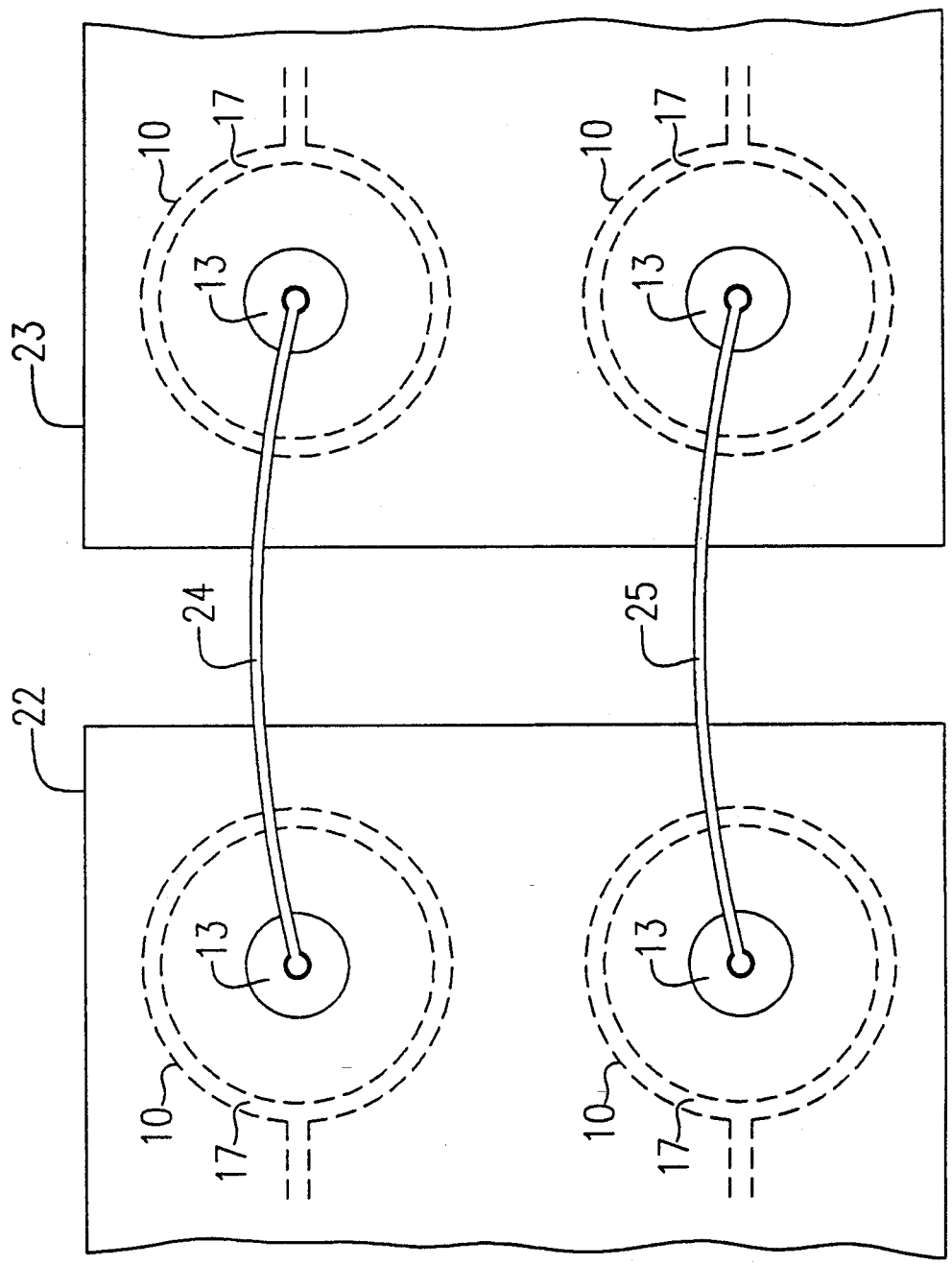

In FIG. 3, two separate chips, 22, 23 have each formed thereon two exemplary high-voltage capacitors 10, similar to the capacitor 10 shown in FIGS. 1 and 2. The capacitors 10 on chip 22 are wire bonded to the corresponding capacitor 10 on the chip 23 by wire bonds 24, 25. Conductors 17 and the first plate (conductive region 12, FIGS. 1, 2) of each capacitor 10 connect to circuitry (not shown) on the corresponding chip 22, 23. It is noted that conductor 17 for each capacitor 10 is shown outlined since it is under layer 18 (FIG. 1). The wire bonds are made to the exposed portion of plates 13.

Using the exemplary structure shown in FIGS. 1 and 2, the following materials and approximate thickness/sizes were used to make a 2 pF, 1600 volt capacitor on a silicon substrate:

| | | |
|---|---|---|
| region 12 | 10 ohm-square N-type silicon | $600 \times 600$ $\mu$m |
| layer 13 | aluminum | $2 \times 10^5$ $\mu$m$^2$ |
| layer 14 | SiO$_2$ | 1.8 $\mu$m |
| layer 16 | phosphorus doped glass | 1.6 $\mu$m |
| ring 17 | aluminum | 590 $\mu$m inner diameter, 20 $\mu$m wide |
| layer 18 | SiN | 2 $\mu$m |

Having described the preferred embodiment of this invention, it will now be apparent to one of skill in the art that other embodiments incorporating its concept may be used. Therefore, this invention should not be limited to the disclosed embodiment, but rather should be limited only by the spirit and scope of the appended claims.

I claim:

1. A capacitor having a first plate and a second plate, the second plate being formed over, and insulated from, the first plate, characterized by:
   a layer of semi-insulating material disposed in contact with the second plate; and,
   a conductor, separate from the first and second plates and in contact with the layer of semi-insulating material.

2. The capacitor as recited in claim 1, wherein the first plate is insulated from the second plate by a layer of dielectric material.

3. The capacitor as recited in claim 3, wherein the semi-insulating material is disposed over the second plate.

4. The capacitor as recited in claim 3, wherein the conductor is a ring disposed adjacent to, and surrounding, the second plate.

5. The capacitor as recited in claim 4, wherein the semi-insulating material is silicon nitride.

6. In an integrated circuit, a capacitor formed on a semiconductor substrate having a surface, the capacitor having a first plate and a second plate, the first plate being formed in the substrate, the second plate being formed over, and insulated from, the first plate, characterized by:
   a layer of semi-insulating material disposed in contact with the second plate; and,
   a conductor, separate from the first and second plates and in contact with the layer of semi-insulating material.

7. The capacitor as recited in claim 6, wherein the first plate is insulated from the second plate by a layer of dielectric material.

8. The capacitor as recited in claim 7, wherein the first plate is a region of high conductivity disposed in the surface of the substrate.

9. The capacitor as recited in claim 8, wherein the semi-insulating material is disposed over the second plate.

10. The capacitor as recited in claim 9, wherein the conductor is a ring disposed adjacent to, and surrounding, the second plate.

11. The capacitor as recited in claim 10, wherein the semi-insulating material is silicon nitride.

12. A method of making a capacitor having a first plate and a second plate, the second plate being formed over, and insulated from, the first plate, characterized by the steps of:
   forming a conductor separate from the first and second plates; and,
   depositing a layer of semi-insulating material in contact with the second plate and the conductor.

13. The method as recited in claim 12, further characterized by the step of:
   depositing a dielectric layer between the first plate and the second plate.

14. The method as recited in claim 13, wherein the semi-insulating layer is deposited over the second plate and the conductor.

15. The method as recited in claim 14, wherein the conductor is a ring disposed adjacent to the second plate.

16. The method as recited in claim 15, wherein the semi-insulating material is silicon nitride.

17. A method of making a capacitor, having first and second plates, along a surface of a semiconductor substrate, characterized by the steps of:
   implanting dopant into the substrate surface to form the first plate of the capacitor;
   depositing a dielectric layer over the implanted dopant;
   depositing a conductive layer over the dielectric layer to form the second plate of the capacitor;
   forming a conductor on the dielectric layer, the conductor being separate from the substrate and the conductive layer; and,
   depositing a semi-insulating layer over, and in contact with, the conductive layer and the conductor.

18. The method as recited in claim 17, wherein the conductor is a ring disposed adjacent to, and surrounding, the conductive layer.

19. The method as recited in claim 18, wherein the semi-insulating material is silicon nitride.

20. A plurality of series coupled capacitors, each capacitor formed on a corresponding integrated circuit substrate and having a first plate and a second plate, the second plate being formed over, and insulated from, the first plate by a dielectric layer, characterized by:
 a layer of semi-insulating material disposed in contact with the second plate; and
 a conductor, separate from the first plate by the layer of dielectric material, separate from the second plate, and in contact with the layer of semi-insulating material.

21. The capacitor as recited in claim 20, wherein the first plate is a region of high conductivity disposed in the surface of the corresponding substrate.

22. The capacitor as recited in claim 21, wherein the semi-insulating material is disposed over the second plate.

23. The capacitor as recited in claim 22, wherein the conductor is a ring disposed adjacent to, and surrounding, the second plate.

24. The capacitor as recited in claim 23, wherein the semi-insulating material is silicon nitride.

* * * * *